(12) United States Patent
Arsovski et al.

(10) Patent No.: US 9,384,835 B2
(45) Date of Patent: Jul. 5, 2016

(54) CONTENT ADDRESSABLE MEMORY EARLY-PREDICT LATE-CORRECT SINGLE ENDED SENSING

(75) Inventors: Igor Arsovski, Williston, VT (US); Daniel A. Dobson, Rochester, MN (US); Travis R. Hebig, Rochester, MN (US); Reid A. Wistort, Westford, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 798 days.

(21) Appl. No.: 13/482,166

(22) Filed: May 29, 2012

(65) Prior Publication Data

US 2013/0326111 A1  Dec. 5, 2013

(51) Int. Cl.
  *G11C 15/04*  (2006.01)
  *G06F 12/02*  (2006.01)
  *G06F 12/00*  (2006.01)

(52) U.S. Cl.
  CPC ........................ *G11C 15/04* (2013.01)

(58) Field of Classification Search
  USPC ............................. 711/102, 108, 154
  See application file for complete search history.

(56) References Cited

U.S. PATENT DOCUMENTS

| | | | |
|---|---|---|---|
| 3,628,642 A * | 12/1971 | Ravenel | 477/81 |
| 5,920,886 A | 7/1999 | Feldmeier | |
| 6,642,749 B1 * | 11/2003 | Wu et al. | 327/55 |
| 6,792,502 B1 * | 9/2004 | Pandya et al. | 711/108 |
| 6,804,134 B1 * | 10/2004 | Proebsting et al. | 365/49.1 |
| 7,019,674 B2 | 3/2006 | Cadambi et al. | |
| 7,102,904 B1 * | 9/2006 | Kwack | 365/49.11 |
| 7,167,032 B1 * | 1/2007 | Barlow | H03K 3/3565 327/205 |
| 7,349,230 B2 | 3/2008 | Parthasarathy et al. | |
| 7,365,661 B2 | 4/2008 | Thomas | |
| 7,471,537 B1 | 12/2008 | Park | |
| 7,689,889 B2 | 3/2010 | Cohen | |
| 7,724,559 B2 | 5/2010 | Arsovski | |
| 7,797,520 B2 | 9/2010 | Grandou et al. | |
| 7,924,588 B2 | 4/2011 | Arsovski et al. | |
| 8,120,937 B2 | 2/2012 | Ji et al. | |
| 8,125,810 B2 | 2/2012 | Bosshart | |
| 8,130,525 B2 | 3/2012 | Arsovski | |
| 8,766,692 B1 * | 7/2014 | Durbha et al. | 327/205 |
| 2003/0123269 A1 * | 7/2003 | Gillingham et al. | 365/49 |
| 2003/0137890 A1 * | 7/2003 | Vlasenko et al. | 365/207 |
| 2008/0025073 A1 * | 1/2008 | Arsovski | 365/149 |
| 2009/0034311 A1 * | 2/2009 | Bosshart | 365/49.17 |
| 2009/0101531 A1 | 4/2009 | Nordholm et al. | |

(Continued)

FOREIGN PATENT DOCUMENTS

WO   03056564   7/2003

OTHER PUBLICATIONS

Fei Yuan, Differential CMOS Schmitt trigger with tunable hysteresis, Aug. 13, 2009, pp. 245-248.*

(Continued)

*Primary Examiner* — Jared Rutz
*Assistant Examiner* — Christopher Do
(74) *Attorney, Agent, or Firm* — David Cain; Andrew M. Calderon; Roberst Mlotkowski Safran & Cole, P.C.

(57) ABSTRACT

Circuits and methods for performing search operations in a content addressable memory (CAM) array are provided. A system for searching a CAM includes a circuit that selectively activates a main-search of a two stage CAM search while a pre-search of the two stage CAM search is still active.

24 Claims, 12 Drawing Sheets

(56) References Cited

U.S. PATENT DOCUMENTS

2009/0210382 A1    8/2009   Louzoun et al.
2010/0049912 A1    2/2010   Mylavarapu
2010/0254204 A1*  10/2010   Best et al. .................... 365/193

OTHER PUBLICATIONS

International Search Report and Written Opinion dated Jan. 10, 2014 in PCT Application No. PCT/US2013/041047, 17 pages.

Mohan, N. et al, "Low Power Dual Matchline Ternary Content Addressable Memory", Circuits and Systems, ISCAS '04, 2004, pp. 633-636.

Sultan, M. et al, "A Low-Power Ternary Content Addressable Memory (TCAM) With Segmented and Non Segmented Matchlines", TENCON IEEE Region 10 Conference, 2008, 5 pages.

Arsovski, I. et al, "A Ternary Content-Addressable Memory (TCAM) Based on 4T Static Storage and Including a Current-Race Sensing Scheme", IEEE Journal of Solid-State Circuits, vol. 38, Issue No. 1, 2003, pp. 155-158.

\* cited by examiner

CONTENT ADDRESSABLE MEMORY EARLY-PREDICT LATE-CORRECT SINGLE ENDED SENSING

FIELD OF THE INVENTION

The invention relates to content addressable memory (CAM) and, more particularly, to circuits and methods for performing search operations in a CAM array.

BACKGROUND

In standard computer memory, e.g., random access memory (RAM), a user provides a memory address and the RAM returns a data word stored at the memory address. In contrast to standard computer memory, content-addressable memory (CAM) receives a data word from the user and searches the entire CAM array, in a single operation, and determines whether the data word is stored anywhere within the CAM array. Because CAM searches its entire memory in a single operation, it is much faster than RAM in search applications.

There are two types of CAM: binary CAM and ternary CAM (TCAM). Binary CAMs provide for the storing and searching of binary bits, i.e., zero and one (0, 1), comprising a data word. Ternary CAMs provide for the storing of three states, i.e., zero, one, and a "don't care" bit (0, 1, X). The "don't care" bit of ternary CAM allows for increased accommodation in searching data words. For example, a ternary CAM may store the data word, "11XX0", which will match any of the searched-for data words: "11000", 11010", "11100", and "11110".

CAM is often used in computer network devices. For example, when a network switch receives a data frame from one of its ports, it updates an internal address table with the frame's source address and the receiving port's identifier. The network switch then looks up the destination address of the data frame in the internal address table to determine a port to which the data frame should be forwarded, and sends the data frame to its destination address on that port. The internal address table is usually implemented by a binary CAM so that the data frame is quickly forwarded to the proper port, reducing the latency of the network switch.

TCAM is frequently used in network routers, where each address has a network address that varies in size depending on the subnet configuration, and a host address, which occupies the remaining bits. The network address and the host address are distinguished by a network mask for each subnet of the network. Routing information to its destination in the network requires a router to look up a routing table that contains each known destination address, the associated network mask, and routing information needed to route packets to the destination address. Routing is performed rapidly by a TCAM, which masks the host portion of the address with "don't care" bits. TCAM, which masks the host address and compares the destination address in one operation, quickly retrieves the routing information needed to route packets to the destination address.

When searching CAM (binary or ternary), search data is loaded onto search lines and compared with stored words in the CAM. During a search-and-compare operation, the CAM performs a fully parallel search and generates a match or mismatch signal associated with each stored word, indicating whether or not the search word matches a stored word.

To allow this fast parallel comparison between all stored words to a single search word, each CAM word contains dedicated search hardware. Each CAM cell contains additional bit-comparison transistors and a storage element, which is typically implemented as a Static Random Access Memory (SRAM) cell. This added circuitry is combined across the CAM word with a match-line (ML) to produce a match or mismatch signal for each CAM word. This search hardware allows the entire contents of the CAM array to be searched in a single clock cycle, e.g., all stored CAM words are searched in parallel. Thus, in contrast to standard memory (e.g., SRAM and DRAM) which would typically require 1K clock cycles to complete a search of 1K words of memory, a CAM has the ability to search all entries simultaneously in a single clock cycle.

Unfortunately, as technology scales to submicron geometries, random device variation (RDV) is becoming more prominent. RDV of parameters such as transistor length, transistor width and transistor threshold voltage can be significant even in identically designed neighboring devices. The effects of RDV are especially evident in the design of semiconductor memories. Because most memories rely on sense amplifiers to detect small voltage signals on largely capacitive array lines, RDV in the memory cells as well as sense-amplifier devices can produce incorrect results. To improve reliability, memory designers tune their sensing circuits conservatively, thereby trading off performance in order to maintain a large sensing margin for reliable operation.

In advanced technologies (e.g., 100 nm and smaller gate geometry), RDV is becoming a major bottleneck for improving performance. As device variation increases, timing uncertainty for signal arrival and data capture increases, requiring larger data capture margins, and therefore limiting performance.

Due to its single-ended nature, the ML sensing performed during the CAM search operation is even more sensitive to RDV than the differential sensing used in the SRAM read circuitry. Thus, to maintain reliable operation, most ML sensing schemes employ full-swing sensing which is both slow and power-inefficient.

CAM design tradeoffs thus include search access time, power, and density. To improve power usage, a two stage sensing scheme is sometimes used for searching the CAM. The two stage sensing scheme includes a pre-compare (e.g., pre-search) and a main-compare (e.g., main-search). In the pre-compare, a small number of the bits in each CAM word are compared to the corresponding bits in the search word prior to the main ML being precharged for the power intensive main-compare. When the pre-compare shows a miss for a particular CAM word, the main-compare is not performed for that word, thus saving the power associated with performing the main-compare.

Traditional timing methodology requires completing the pre-compare before beginning the main-compare. This is becoming problematic, however, when margining (e.g., designing) for variation in the pre-compare CAM cell and/or pre-compare sense circuit. In particular, margining for the slowest statistically relevant pre-compare case results in the main-compare starting later than necessary for most cases. Timing uncertainty increases with device variation as device sizes shrink, and this large timing uncertainty on the pre-search completion is impacting overall CAM performance by delaying the start of the main-compare.

Accordingly, there exists a need in the art to overcome the deficiencies and limitations described hereinabove.

SUMMARY

In an aspect of the invention, there is a system for searching a content addressable memory (CAM). The system includes a circuit that selectively activates a main-search of a two stage CAM search while a pre-search of the two stage CAM search is still active.

In another aspect of the invention, there is a circuit including a pre-search match line (PML) connected to a first plurality of cells of a content addressable memory (CAM). The circuit also includes a main-search match line (MML) connected to a second plurality of cells of the CAM. The circuit also includes a combination of devices structured and arranged to: start a pre-search operation associated with the PML; and start a main-search operation associated with the MML prior to completion of the pre-search operation.

In another aspect of the invention, there is a circuit including an inverting Schmitt trigger having a low threshold, a high threshold, and a hysteresis value. The circuit also includes a tunable pin connected to the Schmitt trigger. The Schmitt trigger and the tunable pin are structured and arranged such that adjusting a voltage on the tunable pin selectively changes the hysteresis value of the Schmitt trigger.

In another aspect of the invention, there is a method of performing a memory operation in a computer memory. The method includes starting a first stage of a two-stage memory operation in the computer memory. The method also includes selectively starting a second stage of the two-stage memory operation while the first stage is still executing and based on preliminary results of the first stage. The method additionally includes detecting a final result of the first stage after the starting the second stage. The method further includes performing one of interrupting and completing the second stage based on the final result of the first stage.

In another aspect of the invention, there is a method of searching a content addressable memory (CAM). The method includes developing a voltage on a pre-search match line (PML) during a pre-search of a two-stage CAM search operation. The method also includes detecting that the voltage exceeds a threshold level. The method further includes starting a main-search of the two-stage CAM search operation based on the detecting and prior to completion of the pre-search. The method additionally includes, after the starting the main-search, performing one of: detecting that the voltage drops below the threshold level and interrupting the main-search; and detecting that the voltage remains above the threshold level and completing the main-search.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to content addressable memory (CAM) and, more particularly, to circuits and methods for performing search operations in a CAM. In accordance with aspects of the invention, an Early-Predict Late-Correct (EPLC) sensing scheme is provided for a two-stage CAM search operation. In embodiments, the EPLC scheme starts the main-search based on preliminary results of the pre-search, without waiting for full completion of the pre-search, such that there is an overlap of the pre-search and the main-search (e.g., early-predict). Moreover, the main-search may be terminated based on later results of the pre-search (e.g., late-correct). In this manner, implementations of the invention provide a faster CAM search operation.

In embodiments, a Ternary Content Addressable Memory (TCAM) uses a two phase search operation where early-prediction on its pre-search results activates the subsequent main-search operation, which is later interrupted only if the final pre-search results contradict the early-prediction. This early main-search activation improves performance by about 30%, while the low-probability of a late-correct has a negligible power impact. In an exemplary non-limiting implementation, the EPLC sensing in accordance with aspects of the invention enables a high-performance TCAM compiler implemented in 32 nm High-K Metal Gate SOI (silicon-on-insulator) process to achieve 1 Gsearch/sec. throughput on a 2048×640 bit TCAM instance while consuming only about 0.76 W of power. Embedded Deep-Trench (DT) capacitance for power supply noise mitigation adds about 5% overhead for a total TCAM area of about 1.56 mm$^2$.

Aspects of the invention are described herein with respect to CAM. The invention is not limited to use with CAM, however, and the inventive EPLC sensing scheme described herein may be used with any suitable two-stage sensing process in which the second stage normally begins only after full completion of the first stage. For example, implementations of the invention may be used with any two-stage memory operation where the results of the second operation (second stage) are dependent on the first operation (first stage), and in which the second operation is started based on preliminary results of the first operation, and later completed or interrupted based on the final results of the first operation while the second operation is executing. Such a scheme may be used with, for example, DRAM, SRAM, and non-volatile memories.

Figure 1:
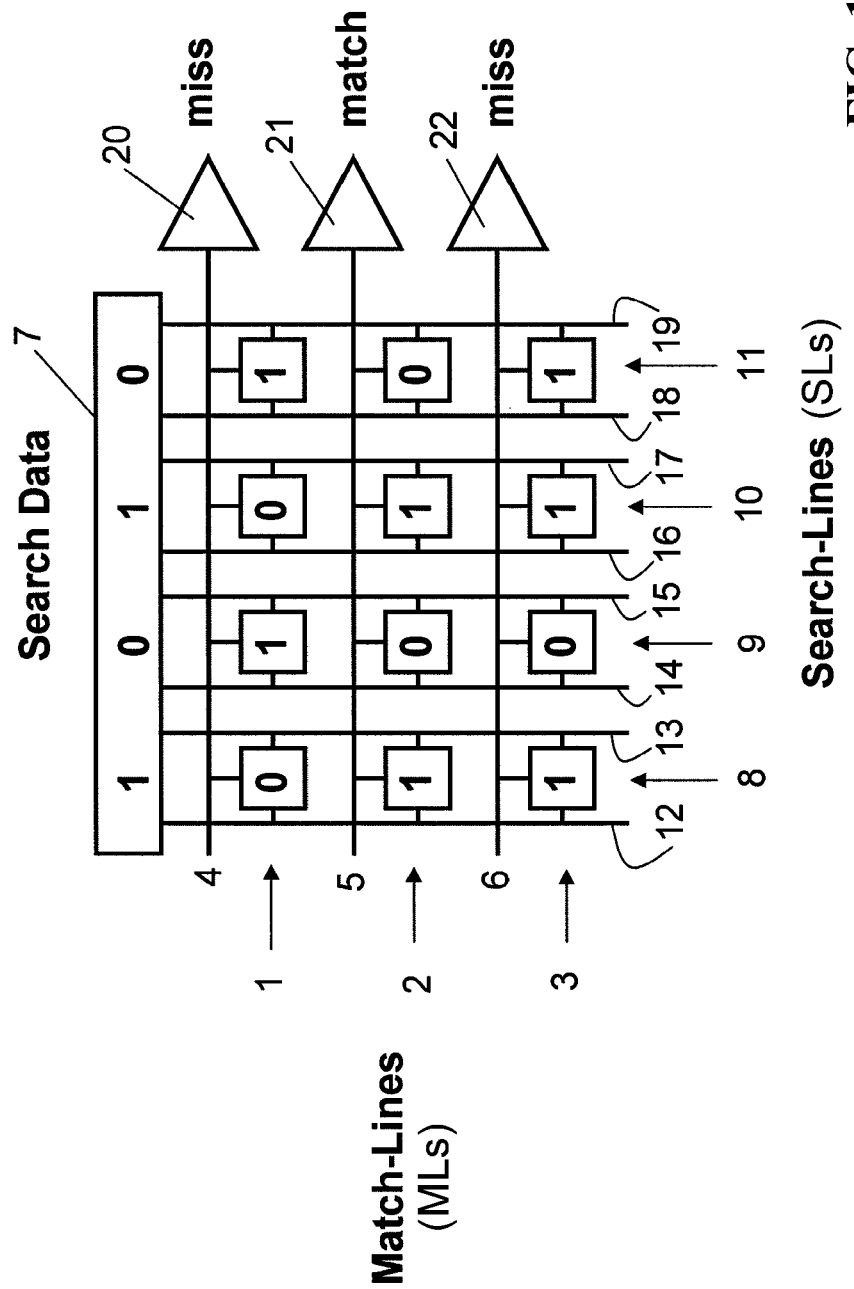
FIG. 1 illustrates a block diagram of a 3×4 bit binary CAM.

FIG. 1 illustrates a simplified block diagram of a 3×4 bit binary CAM. The binary CAM cells are arranged into three horizontal words, each four bits long. The binary CAM cells contain both storage and comparison circuitry. The vertically paired search-lines (SLs) apply, in parallel, the bits, 0 or 1, of the search data word to the binary CAM cells. The match-lines (MLs), which run horizontally, compare whether each bit of the search data word matches each bit of the stored data word of a row of binary CAM cells. If a match occurs, the match-line indicates a match.

In the exemplary binary CAM shown in FIG. 1, CAM cells are arranged in horizontal rows 1, 2, and 3, composed of, e.g., four cells. Each CAM cell of a respective horizontal row is coupled to MLs 4, 5, and 6. As the number of cells in a row corresponds to the length of the word to be searched, any number of cells can be utilized by those ordinarily skilled in the art without departing from the spirit of the invention. Further, for the sake of explanation, only three rows and MLs 4-6 are shown. Again, any number of rows and MLs can be utilized by the ordinarily skilled artisan. Moreover, the CAM cells are arranged in columns 8, 9, 10, and 11. While only four columns are shown, the number of columns corresponds to the number of bits in the CAM cell word to be searched, such that any number of columns can be utilized.

Search data 7, i.e., the data word to be searched, is provided for comparison with each word formed in CAM rows 1-3. Parallel search lines (SLs) 12-19 are coupled to search data 7, and each CAM cell in a respective column is coupled to two search lines so that each cell corresponding to a data bit of the search data 7 can be searched for a match. Thus, search data 7 is applied to SLs 12-19 in parallel. Search results develop on MLs 4-6 in parallel and are applied to respective sense amplifiers 20-22.

Figure 2:
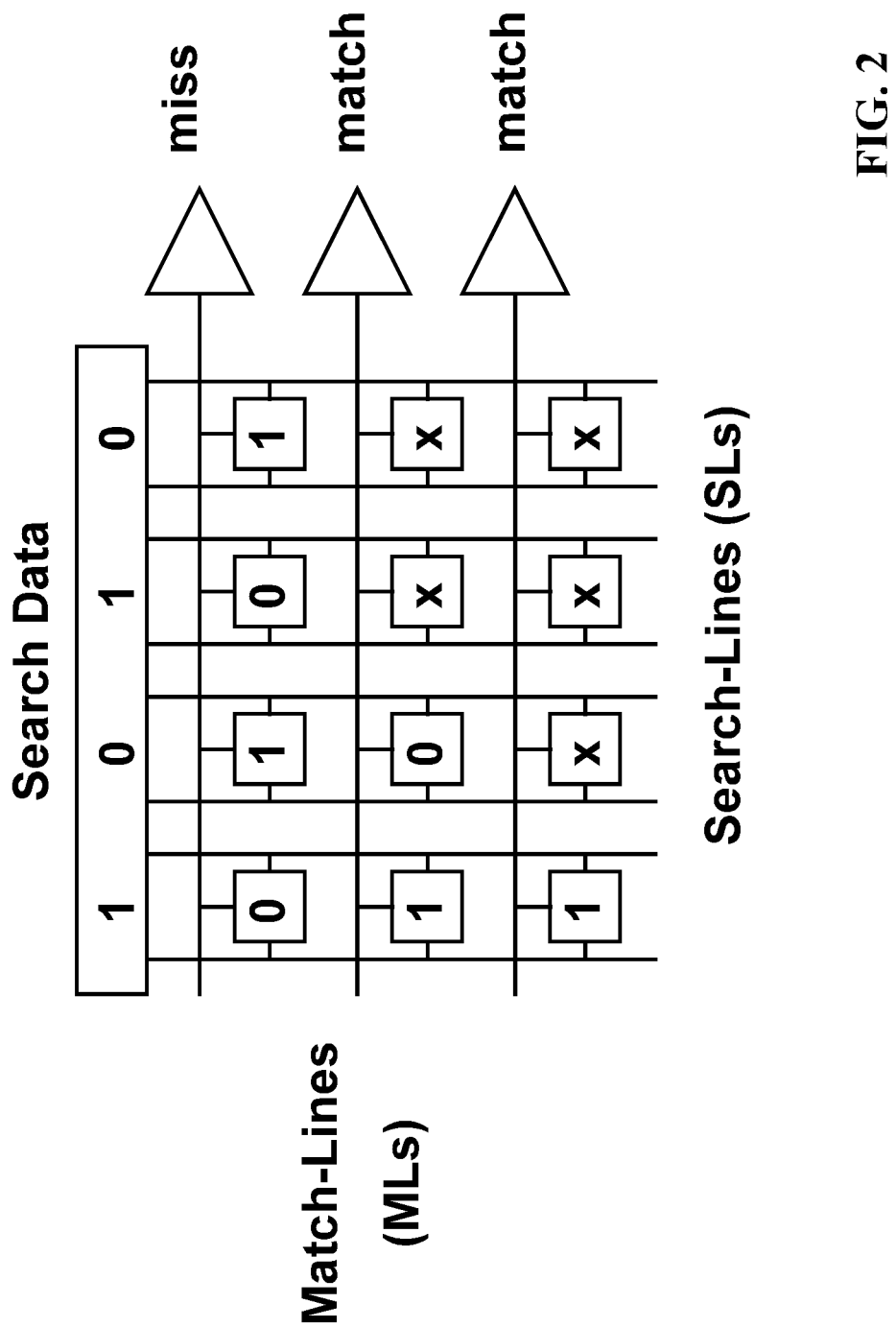
FIG. 2 illustrates a block diagram of a 3×4 bit TCAM.

FIG. 2 illustrates a simplified block diagram of a 3×4 bit ternary CAM (TCAM). Like the binary CAM cells of FIG. 1, the ternary CAM cells of FIG. 2 are arranged into three horizontal words, each four bits long. Similarly, the vertically paired search-lines (SLs) apply, in parallel, the bits, 0 or 1, of the search data word to the ternary CAM cells. However, the storage and comparison circuitry of the ternary CAM cells may also store the "don't care" bit, X, and compare each individual "don't care" bit X with a corresponding bit of the applied search data word. As indicated by FIG. 2, the presence of "don't care" bits X in two of the three stored data words, allows two of three of the match-lines (MLs) to be activated.

Referring to FIGS. 1 and 2, a binary or ternary CAM search begins with pre-charging all MLs high, putting them all temporarily into the match state. Next, search-line drivers broadcast the search data word onto the SLs. Then, each CAM cell compares its stored bit or state against the bit on its corresponding SLs. CAM cells with matching bits do not affect the ML, but CAM cells with a mismatch pull the ML down to ground. Ternary CAM cells storing an X operate as if a match had occurred. The aggregate result is that MLs are pulled down for any search data word that has at least one individual bit mismatch. All other MLs remain activated, i.e., high.

Figure 3:
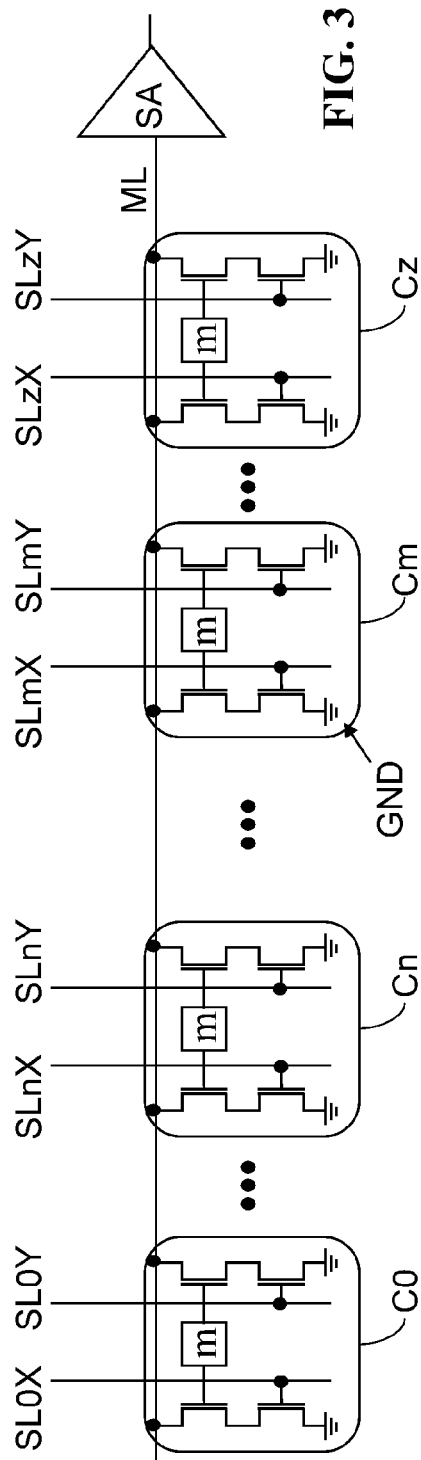
FIG. 3 illustrates the concept of precharging a match-line (ML) for CAM sensing.

FIG. 3 illustrates the concept of precharging the match-line (ML) for CAM sensing. In particular, FIG. 3 depicts a row of cells in a CAM, e.g., one of the horizontal rows of cells shown in FIG. 2. Each cell, e.g., C0, Cn, Cm, Cz, is coupled to the ML. Moreover, each cell, which can be in binary or ternary form, includes a storage element "m", e.g., an SRAM or DRAM, and a pair of stacks of nFETs (n-type field effect transistors) coupled between the ML and ground (GND). The upper nFET of each stack is coupled to the storage element "m", while the lower nFETs are coupled to the pair of SLs associated with the cell column. Each cell, e.g., C0, Cn, Cm, Cz, may be an SRAM-based TCAM cell comprising sixteen FETs, as is known to those of ordinary skill in the art.

Still referring to FIG. 3, for a search operation, the SLs (e.g., SL0X, SL0Y, SLnX, SLnY, SLmX, SLmY, SLzX, SLzY) are initially set to ground and the ML is precharged high (e.g., to VDD). The search data is then applied on the SLs, causing the results to develop on the ML. For each cell, when the bit in the storage element "m" does not match the data on its SLs (e.g., a miss), the mismatched nFET stacks create a path from the ML to ground (GND), thus pulling the ML low. On the other hand, when the bit in the storage element "m" of a cell matches the data on its SLs (e.g., a match), the cell does not create a path between the ML and ground (GND). The ML stays high when the bits in all cells match the data on the respective SLs, whereas the ML can be pulled low when at least one bit does not match the data on its respective SLs. The signal on the ML is applied to the sense amplifier (SA) that differentiates whether the ML is at VDD or ground (GND).

Figure 4:
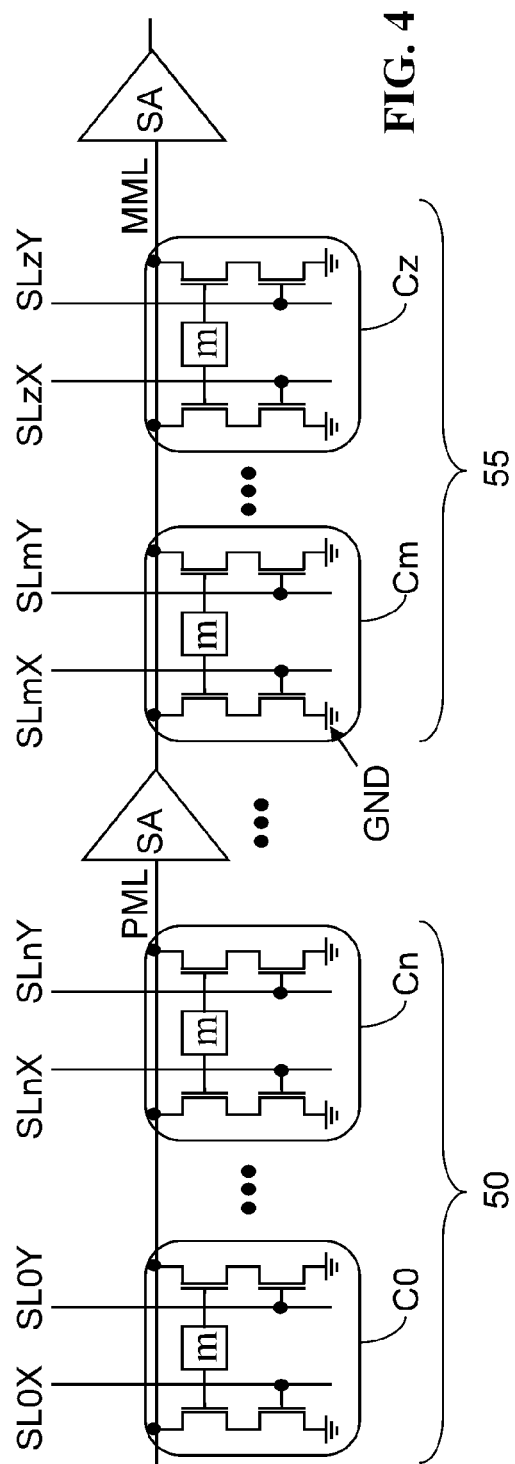
FIG. 4 illustrates a two-stage CAM sensing scheme.

FIG. 4 illustrates a two-stage CAM sensing scheme. In particular, FIG. 4 shows the same row of cells (e.g., C0, Cn, Cm, Cz) as shown in FIG. 3 with additional circuitry that operates to pre-search a first subset 50 of the cells connected to a pre-search match-line (PML). The additional circuitry activates the main-search of a second subset 55 of the cells only when all of the pre-search bits match. Typically, the number of cells in the first subset 50 is much smaller than the number of cells in the second subset 55. For example, the first subset 50 may include eight cells and the second subset 55 may include 120 cells, although the first and second subsets may be defined in any desired manner to include any number of cells.

The two-stage scheme depicted in FIG. 4 is useful for reducing the power consumed during a CAM search. For example, a two stage scheme can save up to 40% of dynamic search power by avoiding charging the main-search match-line (MML) for the cells of the main-search when there is a miss in the pre-search. However, the conventional two stage scheme increases the time involved in performing a search of the CAM since the main-search is commenced only after the pre-search is complete.

Figure 5:
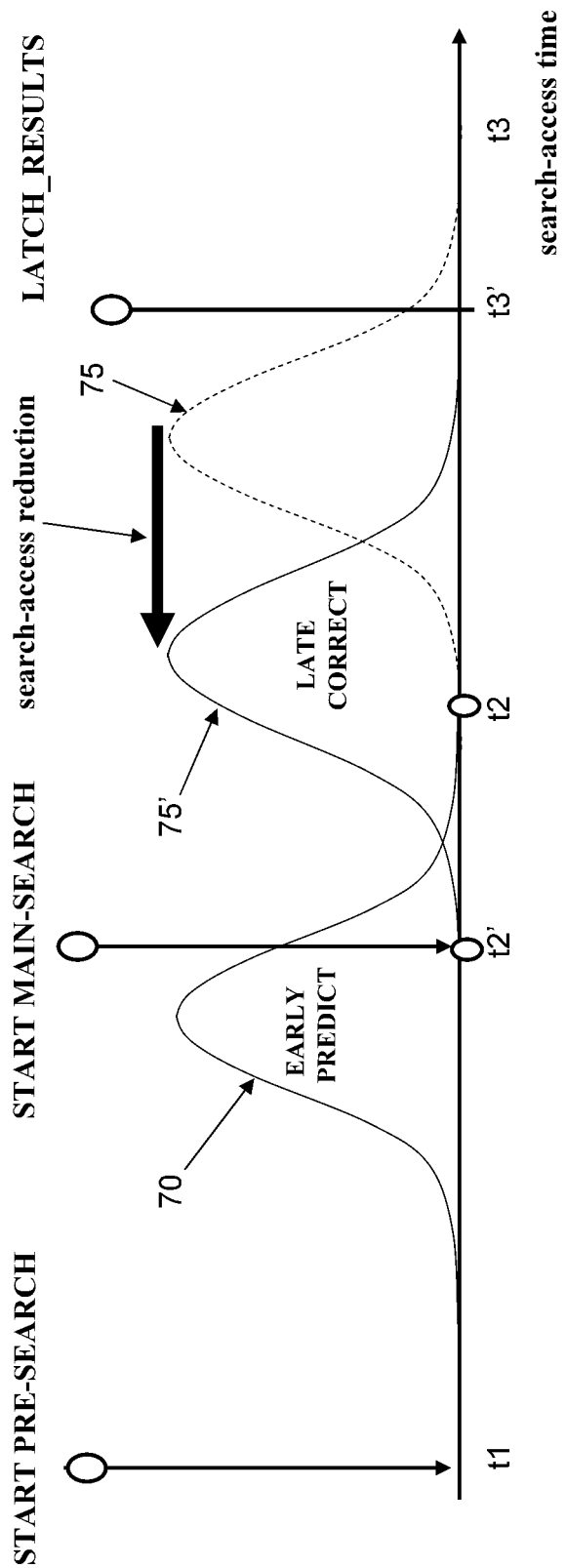
FIG. 5 illustrates early activation of a main-search in accordance with aspects of the invention.

FIG. 5 illustrates the concept of early activation of the main-search in accordance with aspects of the invention. The horizontal axis represents search access time involved in a two stage CAM search. The pre-search, e.g., similar to that described above with respect to FIG. 4, is started at time t1. The curve 70 is a distribution curve that represents the probability that all of the cells of the pre-search have completed the pre-search sense operation. The shape of curve 70 is based on timing analysis and takes into account device variation (e.g., RDV) of the circuit elements involved in the pre-search. Time t2 represents the time when the pre-search is fully complete. For example, time t2 may represent the expected time for a 5-sigma (5σ) CAM cell to complete the pre-search sense operation. Time t2 is also the point at which the main-search is started in a conventional two stage scheme. Curve 75 is a distribution curve that represents the probability that all of the cells of the main-search have completed the sense operation, e.g., based on timing analysis and expected device variations. Time t3 is the point at which the main-search is fully complete.

Still referring to FIG. 5, according to aspects of the invention, the main-search is started prior to the pre-search being fully complete. For example, the main-search may be started at time t2' which is earlier than t2. Curve 75' is similar to curve 75 but starts at time t2' instead of time t2 and ends at time t3' instead of time t3. Implementations of the invention thus improve search access by using this low probability main-search activation to allow an overlap between these conventionally separate operations, e.g., starting the main-search with only preliminary pre-search results, and later correcting the main-search if the final pre-search results contradict the early-prediction.

Figure 6:
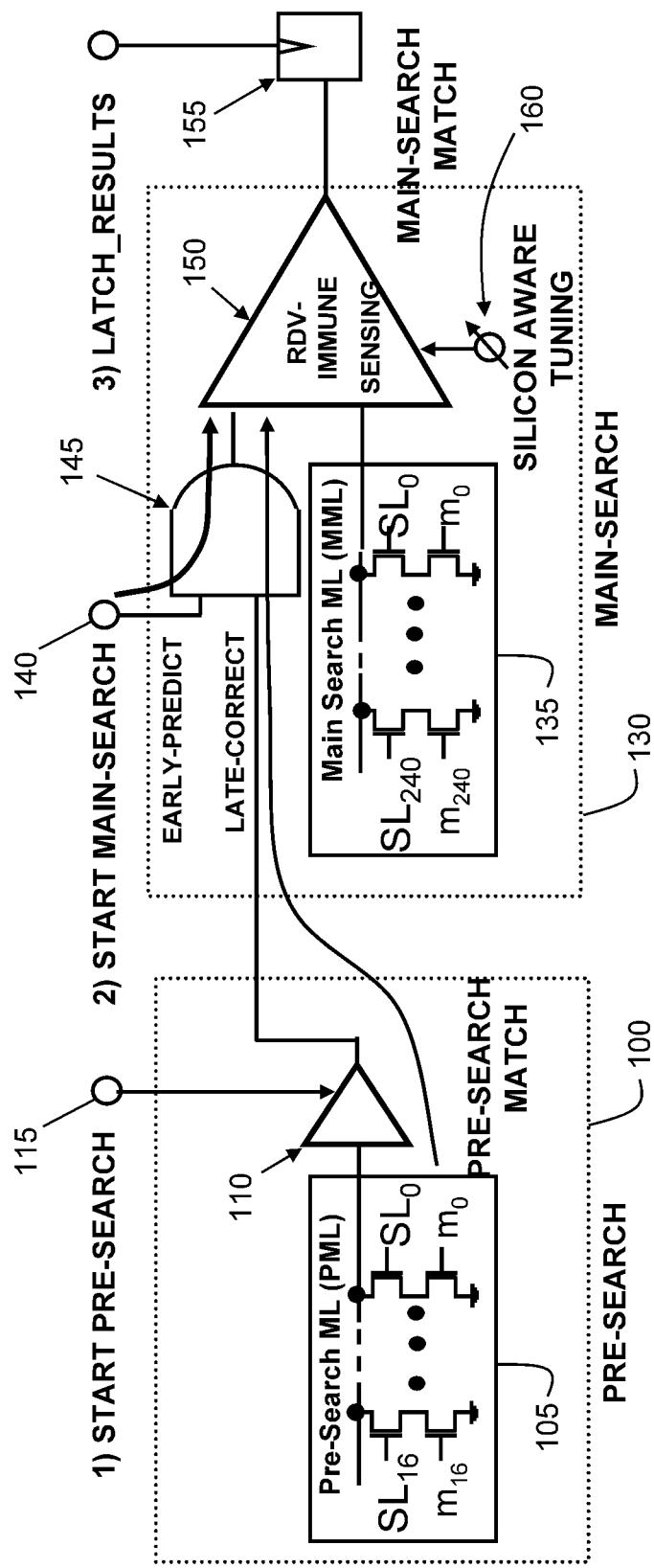
FIG. 6 depicts a high level block diagram of an Early-Predict Late-Correct (EPLC) CAM sensing scheme in accordance with aspects of the invention.

FIG. 6 depicts a high level block diagram of the Early-Predict Late-Correct (EPLC) CAM sense scheme in accordance with aspects of the invention. Block 100 represents the pre-search operation. In particular, block 105 represents the first subset of CAM cells (e.g., similar to subset 50 in FIG. 4) connected to the pre-search match line (PML). In embodiments, block 105 includes eight SRAM-based TCAM cells including 16 NOR pull-down stacks (e.g., such as those described in FIGS. 3-4) corresponding to eight bits of the CAM word, although other numbers of cells may be used in the pre-search subset within the scope of the invention. In embodiments, the PML is pre-charged to a high level (e.g., to VDD) such that the output of the pre-search sense circuit 110 remains high (e.g., binary high) as long as the bits stored in the CAM cells in block 105 match the corresponding bits on the SLs (e.g., in a manner similar to that described in FIGS. 3-4). The Start Pre-Search (SPS) node 115 controls starting the pre-search.

Block 130 represents the main-search operation in accordance with aspects of the invention. In particular, block 135 represents the second subset of CAM cells (e.g., similar to subset 55 in FIG. 4) connected to the main-search match line (MML). In embodiments, block 135 includes 120 SRAM-based TCAM cells including 240 NOR pull-down stacks (e.g., such as those described in FIGS. 3-4) corresponding to 120 bits of the CAM word, although other numbers of cells may be used in the main-search subset within the scope of the invention.

A Start Main-Search (SMS) node 140 controls starting the main-search. In embodiments, the output of the pre-search sense circuit 110 and the signal at SMS node 140 are input to circuit 145. The output of the circuit 145 is connected to the main-search sense circuit 150. In embodiments, the circuit 145 comprises a combination of devices that activates the main-search sense circuit 150 only when both node 140 and the output of pre-search sense circuit 110 are high. The main-search sense circuit 150, when activated, causes charging of the main-search match line (MML) charged for the main-search. Latch 155 holds the value of the search result, which indicates whether the CAM word matches the search word. Silicon aware tuning (SAT) circuit 160 provides silicon-aware self-referenced sensing, as described in greater detail herein.

Still referring to FIG. 6, the early-predict aspect of implementations of the invention resides in the fact that the main-search is begun based on preliminary pre-search results, e.g., before the pre-search is fully complete. In embodiments, the SMS node 140 is driven high (e.g., turned on) when the PML is above a threshold level at a predetermined time after the start of the pre-search, the predetermined time being less than an amount of time for the pre-search to be considered fully complete. In this manner, the main-search is started while the pre-search is still active when preliminary results of the pre-search indicate a match, even though there is still the possibility that the pre-search will later result in a miss.

The late-correct aspect of implementations of the invention resides in the fact that the main-search may be stopped based on results of the pre-search after the main-search has already begun. In embodiments, the PML may be pulled low (e.g., lower than the threshold level) by a missed bit in the pre-search cells in block 105 after the main-search has begun. In such an event, the output of the pre-search sense circuit 110 goes low, which causes the circuit 145 to turn off the main-search sense circuit 150. In this manner, implementations of the invention use early-prediction on the first 8-bit pre-search results to prematurely activate the subsequent 120 bit main-search operation, and then later correct (e.g., interrupt) the main-search only if the final pre-search results contradict the early-prediction.

Figure 7:
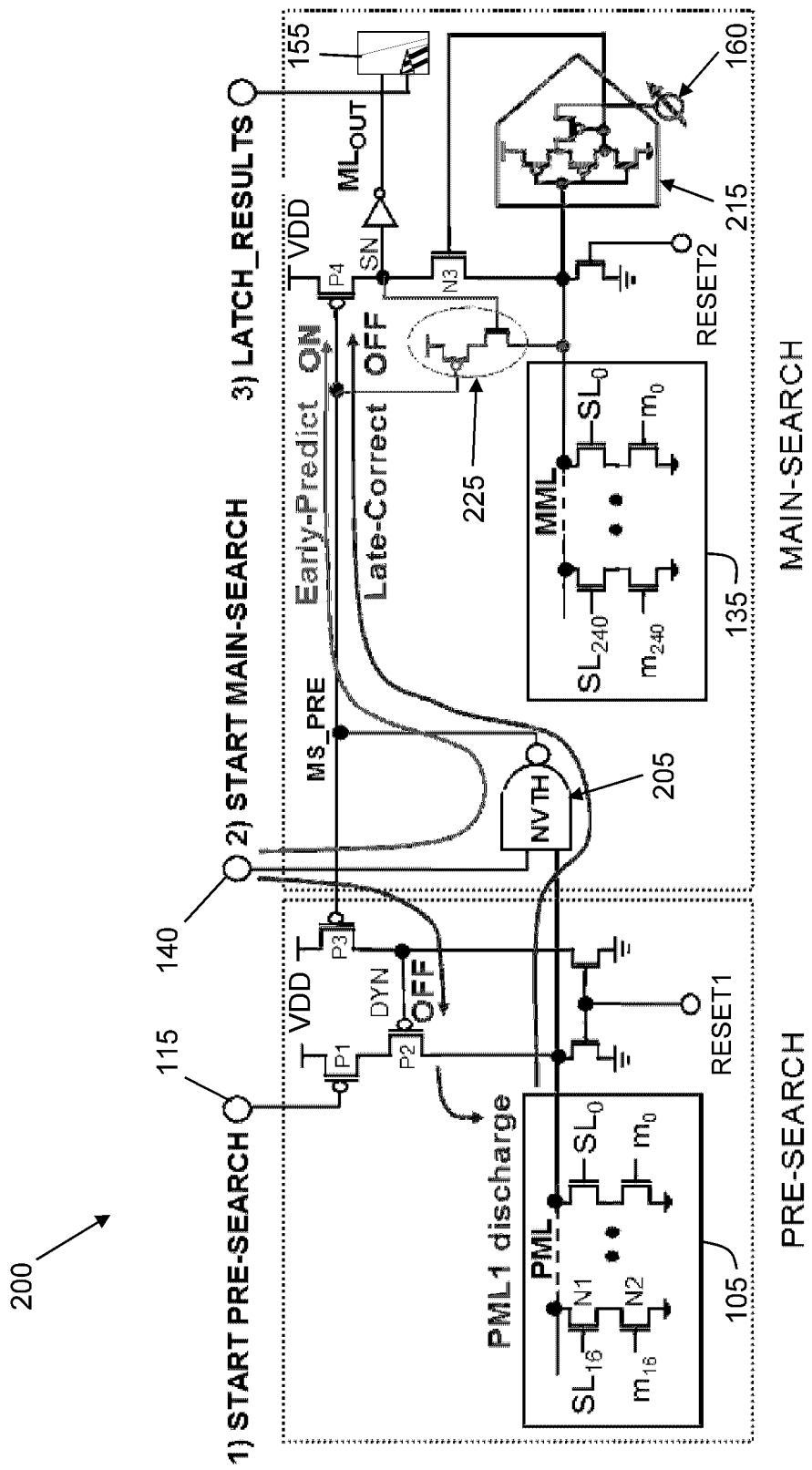
FIG. 7 shows an exemplary transistor-level implementation of an EPLC circuit in accordance with aspects of the invention.
Figure 8:
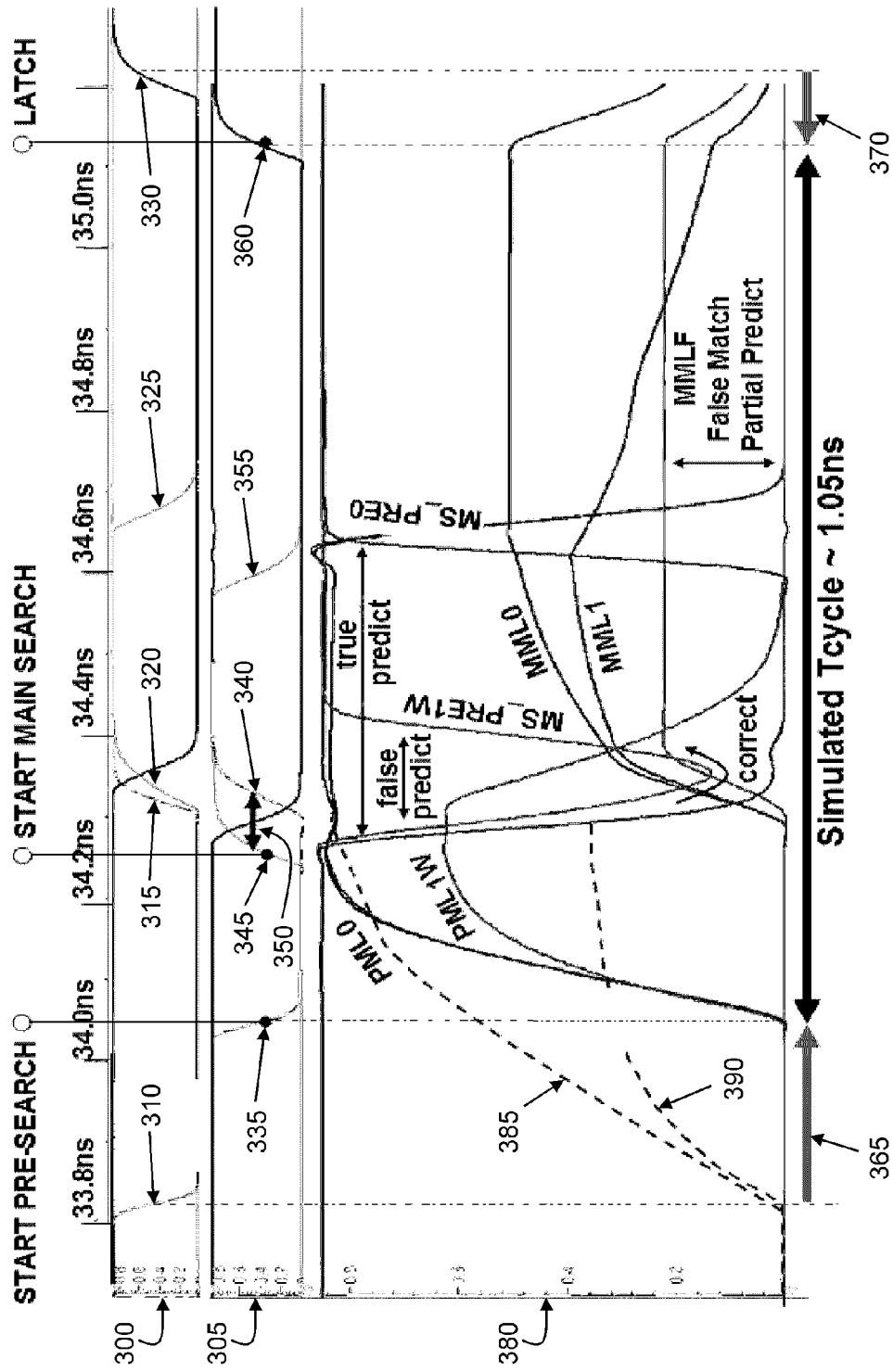
FIG. 8 shows simulation data corresponding to the operation of an EPLC circuit in accordance with aspects of the invention.

FIG. 7 shows an exemplary transistor-level implementation of an EPLC circuit 200 for a single CAM word (e.g., corresponding to a single horizontal row in FIG. 1 or 2) in accordance with aspects of the invention. FIG. 8 shows simulation data corresponding to the circuit of FIG. 7. The EPLC circuit 200 includes blocks 105 and 135, including their respective NOR pull-down stacks as described with respect to FIG. 6. The EPLC circuit 200 also includes the PML, MML, SPS node 115, SMS node 140, latch 155, and SAT circuit 160 as described above with respect to FIG. 6.

The EPLC circuit 200 may be utilized with a binary CAM or a TCAM. Moreover, each searchable word of a CAM (or TCAM) may be provided with an instance of the EPLC circuit 200.

In embodiments, SPS node 115 is initially held high (e.g., 1) and SMS node 140 is initially held low (e.g., 0) prior to the EPLC CAM search. A high reset voltage is applied to RESET1 and RESET2 to reset the PML, the MML, and the latch 155. The EPLC CAM search starts with stable data on all NOR pull-down stacks in blocks 105 and 135, and a low-going signal is applied on RESET1, RESET2, and SPS node 115. Driving SPS node 115 low starts the pre-search phase by turning on P1, which is connected to a voltage source such as VDD. As P1 and P2 start to source current, the voltage on PML develops as a function of the number of mismatched pull-down stacks. In embodiments, P1 and P2 are pFETs (p-type field effect transistors) that operate as a pull-up device in the sense that they selectively connect the PML to the voltage source (VDD).

Still referring to the EPLC circuit 200 in FIG. 7, when the cells in block 105 have no mismatches with the search data, the PML is purely capacitive and quickly ramps from GND to VDD across a NAND gate 205 threshold voltage (NVTH). This situation is illustrated by line PML0 in FIG. 8. On the other hand, when there are a large number "N" of mismatches between the search data and cells in block 105, the PML is held firmly at GND by the "N" active pull-down stacks. In this case, the pre-search indicates a miss such that the main-search is not started, and the latch 155 stores a value indicating a miss.

In a particular case, block 105 contains a single mismatched cell. This may be considered a worst case mismatch since there is only a single mismatched pull-down stack in contention with the pull-up stack (P1 and P2), resulting in a mid-level voltage on the PML. This situation is illustrated by line PML1W in FIG. 8, with the "1" in PML1W indicating a single mismatched cell and the "W" indicating a greater than 3-sigma (>3σ) weak pull-down.

In embodiments, to improve pre-search performance, the EPLC circuit 200 uses current-race sensing with oversized P1 and P2 pull-up devices that not only allow a fast pre-search evaluation for a PML0 situation, but also cause a PML1W situation to erroneously look like a PML0 situation. In this manner, the statistically improbable PML1W situation that crosses the NVTH will early-predict a false match, and proceed to activate the main-search operation. However, this false early-predict is later corrected during the main-search execution, ensuring reliable EPLC search results.

Still referring to the EPLC circuit 200 in FIG. 7, when the PML is above the threshold level (e.g., NVTH) and SMS node 140 is low, the NAND gate 205 has a high output at MS_PRE, which turns off pFETs P3 and P4. The main-search is started by applying a high signal to SMS node 140. A high signal at SMS node 140 coupled with a high signal on PML drives MS_PRE low, which turns on P3, which turns off P2, which, in turn, stops the pre-charge of the PML and leaves the PML floating. MS_PRE going low also turns on P4, which starts the pre-charge of the MML. The signal at SMS node 140 is subsequently driven low, which stops the pre-charging of the MML and permits the main-search operation to proceed. The main-search continues for a pre-defined amount of time until the result of the search (ML_OUT) is eventually obtained from inverter 210 and latch 155.

In embodiments, the MML is connected as the input of an inverting Schmitt trigger 215, which exhibits hysteresis via a high threshold and a low threshold as is understood by those of ordinary skill in the art. The output of the Schmitt trigger 215 is connected to the gate of nFET N3, which is connected between the sense node (SN) and the MML.

In further embodiments, the EPLC circuit 200 includes the SAT circuit 160 operatively connected to the Schmitt trigger 215 and an MML Keeper 225 comprising a pFET-nFET stack connected between MS_PRE and MML, as depicted in FIG. 7. The operation of the SAT circuit 160 and MML Keeper 225 are described below with respect to FIGS. 9 and 10.

FIG. 8 shows simulation data corresponding to the operation of EPLC circuit 200 of FIG. 7, as already noted above. The horizontal axis in FIG. 8 represents search time. Area 300 represents the pre-search and main-search controls signals for a conventional two-stage CAM search circuit. Area 305 represents exemplary pre-search and main-search controls signals (e.g., the signals applied at SPS node 115 and SMS node 140) for an EPCL circuit 200 in accordance with aspects of the invention.

As can be seen in area 300 of FIG. 8, the start pre-search (SPS) signal of a conventional circuit goes from high to low at 310, and then from low to high at 315. The time between 310 and 315 represents the fully completed pre-search of a conventional circuit. After completion of the pre-search (e.g., after 315), the conventional circuit starts the main-search by driving the start main-search (SMS) signal from low to high at 320. The SMS signal is subsequently driven low again at 325, and the result is read from the latch at 330.

Referring to area 305 of FIG. 8, in exemplary implementations of the EPCL circuit 200, the SPS signal (e.g., at SPS node 115 in FIG. 7) is driven from high to low at 335, and then from low to high at 340. In accordance with aspects of the invention, the SMS signal (e.g., at SPS node 140 in FIG. 7) is driven from low to high at 345 at a time prior to 340. As such, the main-search is initiated prior to full completion of the pre-search, e.g., there is an overlap 350 of the pre-search and the main-search. This overlap 350 illustrates the early-predict aspect of the invention. The SMS goes low at 355 and the result is read at 360. It is thus evident from that the EPCL circuit 200 is configured to start the main-search while the pre-search is still active.

As can be seen from areas 300 and 305, implementations of the invention provide a shorter search time for a two-stage CAM search when compared to a conventional two-stage CAM search. In particular, as illustrated at 365, the pre-search time of implementations of the invention is shorter than the pre-search time of a conventional circuit. And as illustrated at 370, implementations of the invention permit the result to be read sooner than in a conventional circuit. For example, embodiments of the invention are capable of providing a search time of about 1.05 ns. In this manner, implementations of the invention provide a faster CAM search time when compared to a conventional two-stage CAM search circuit.

Still referring to FIG. 8, area 380 depicts simulated voltages on various lines of the EPCL circuit (e.g., circuit 200 of FIG. 7) in accordance with aspects of the invention. The voltages at area 380 correspond to the signals in area 305. Lines PML0, MS_PRE0, and MML0 represent, respectively, the voltages of the PML, MS_PRE, and the MML of the EPCL circuit 200 when there are no misses in the pre-search. Lines PML1W, MS_PRE1W, and MML1 represent, respectively, the voltages of the PML, MS_PRE, and the MML of the EPCL circuit 200 when there is one miss (e.g., one non-matching bit) in the pre-search. The dashed lines 385 and 390 represent the voltage of a conventional PML using conventionally sized pull-up devices (e.g., smaller than P1 and P2 of FIG. 7), whereas the PML0 and PML1W lines correspond to the oversized pull-up devices P1 and P2 in accordance with aspects of the invention.

In the PML0 situation, the PML voltage remains above the NAND gate threshold (e.g., NVTH of FIG. 7). On the other hand, in the PML1W situation, the PML discharges when it is no longer being pulled high (e.g., by P1 and P2 in EPCL circuit 200 of FIG. 7). This discharging of the PML in the PML1W situation occurs after the main-search has begun, and drives the NAND gate output high, which turns off P4 and stops the main-search. This illustrates the late-correct aspect of the invention. This is illustrated in FIG. 8 where MS_PRE1W starts the false main-search precharge by dropping low, and is later corrected by returning high. As seen by the partial pre-charge of the false match (MMLF), this late-correct does consume additional power; however the probability of a single-bit miss occurring on a >3σ weak pull-down makes the total power contribution insignificant. In this manner, the EPCL circuit 200 is configured to: start the main-search prior to completion of the pre-search based on detecting that the PML voltage exceeds NVTH and, after starting the main-search, perform one of: detect that the PML voltage drops below NVTH and interrupt the main-search, or detect that the PML voltage remains above the NVTH and complete the main-search.

In embodiments, the main-search uses a silicon-aware version of the Self Referenced Sensing Scheme (SRSS). As shown in FIG. 8, the precharge voltage on the MML in the MML0 and MML1 situations quickly saturates to the high-threshold of the Schmitt trigger (e.g., Schmitt trigger 215 of FIG. 7), while a multiple miss MML stays below the high-threshold. When the precharge of the MML is complete, the MML voltage remains above the Schmitt trigger low threshold in the MML0 situation signaling a match. On the other hand, in the MML1 situation, when the precharge of the MML is complete, the MML voltage quickly drops below the low threshold of the Schmitt trigger signaling a miss. With the SRSS precharge so close to the sense-voltage, the Schmitt trigger hysteresis should be configured to ensure that leaky fast-corner MML0s (with $IOFF_{240}$) do not result in a false miss, while also ensuring that weak slow-corner MML1s (with $ION_1$) do not resolve as a false match.

Figure 9:
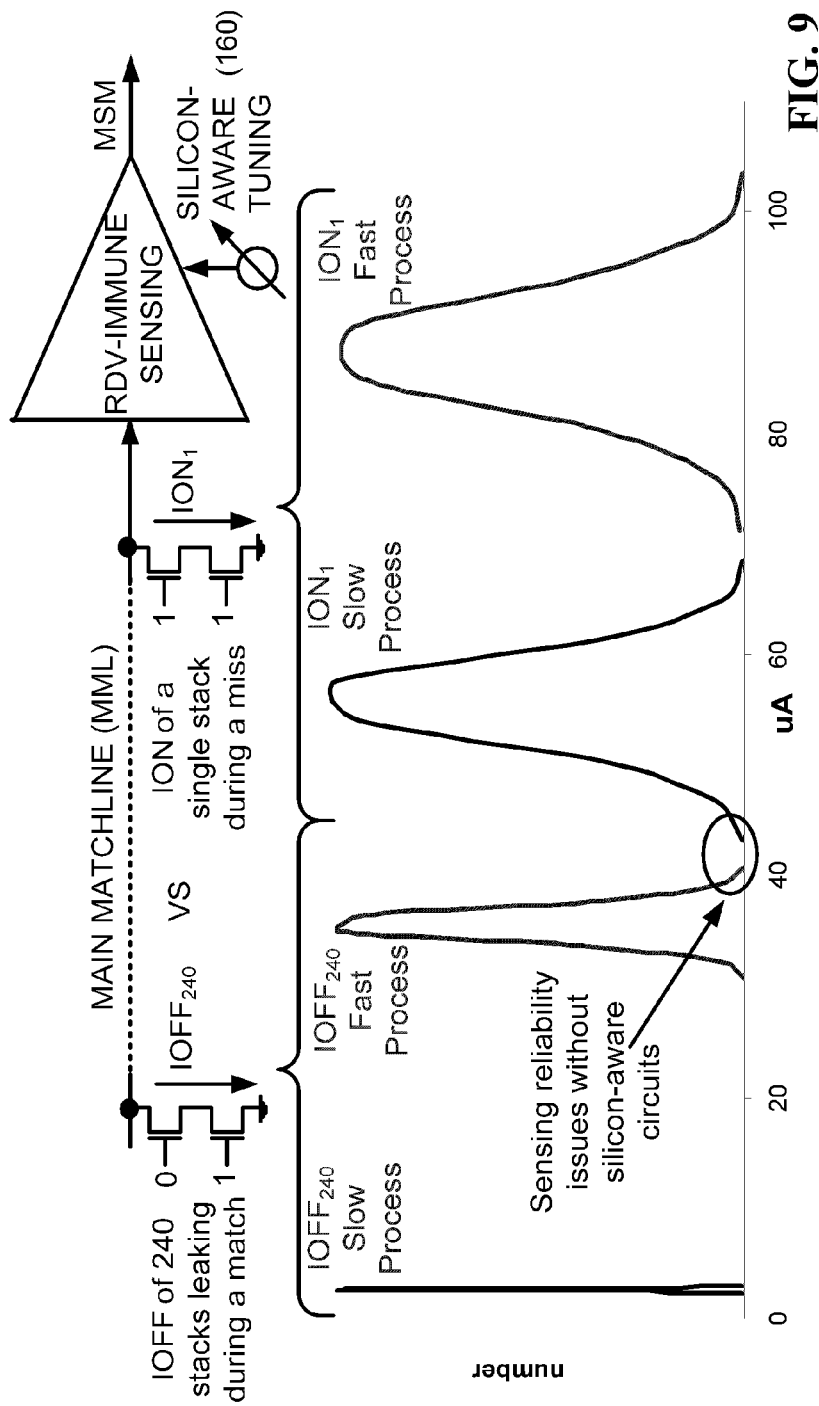
FIG. 9 shows normalized distributions at the slow and fast process corners in accordance with aspects of the invention.

FIG. 9 illustrates the sensing challenge through the normalized $ION_1$ and $IOFF_{240}$ distributions at both the slow and fast process corners in accordance with aspects of the invention. Without silicon aware Sense Amp (SA) tuning, a single SA needs to satisfy both process corners with an $ION_1/IOFF_{240}$ ratio as low as 1.5. With silicon aware SA tuning, fast process SAs can be margined to be high leakage tolerant, while slow process SAs can be margined to be weak signal tolerant, increasing the $ION_1/IOFF_{240}$ ratio by about 60%.

In implementations of the invention, this margining is implemented through the combination of a Silicon Aware Tunable pin (e.g., the SAT circuit 160) on the Schmitt trigger (e.g., Schmitt trigger 215) and a keeper stack on MLL (e.g., MML keeper 225). Setting the SAT circuit 160 to GND in fast process corners enables about 60 mV additional hysteresis in the Schmitt trigger 215 providing about a 50% improved leakage tolerance. Setting the SAT circuit 160 to VDD in slow process corners removes the hysteresis and improves the response to the weak signal development.

Figure 10:
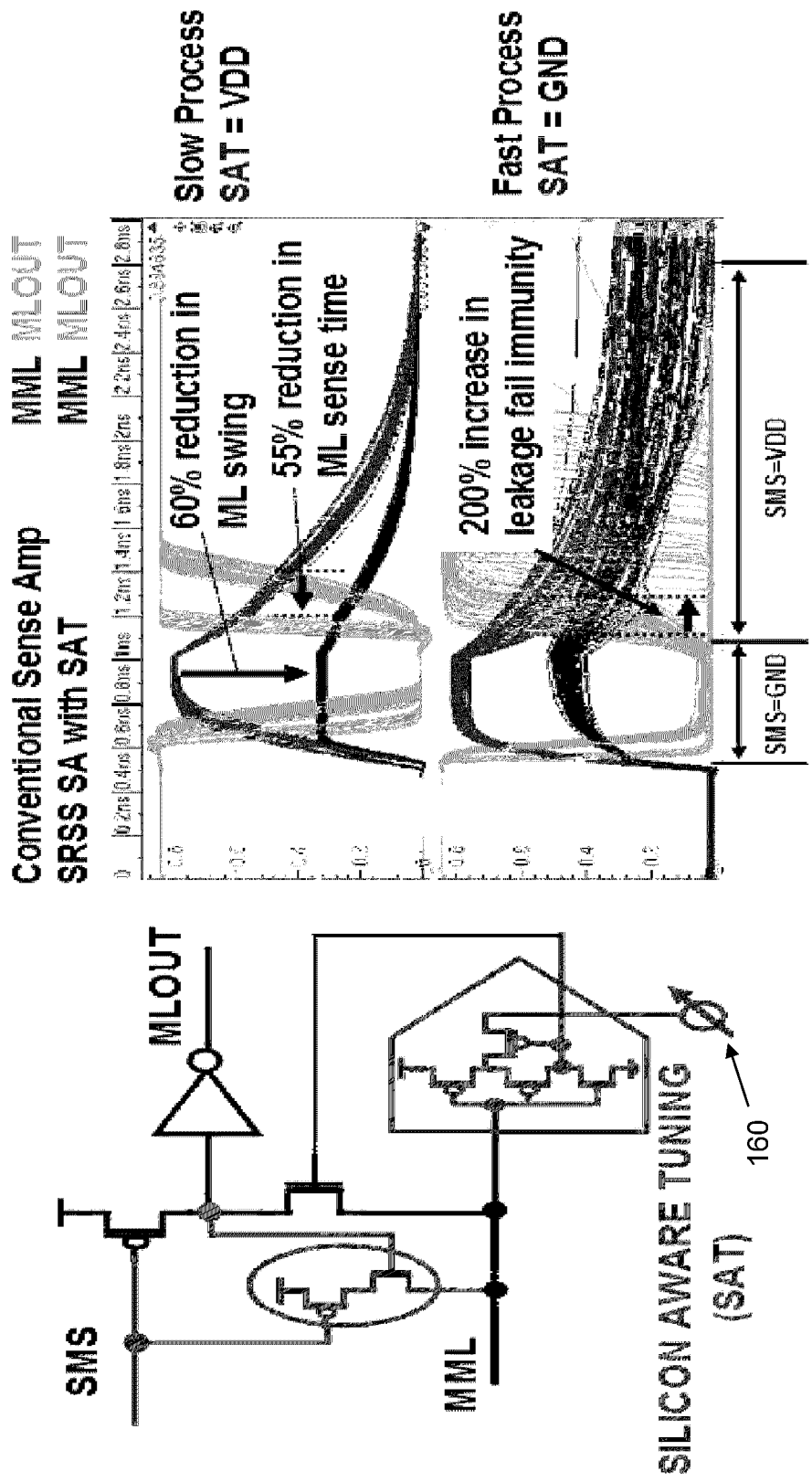
FIG. 10 shows simulation data related to silicon aware tuning in accordance with aspects of the invention.

FIG. 10 shows the improvement in both the power and performance for both settings of SAT circuit 160 over the conventional precharge high ML sensing according to aspects of the invention. By using the silicon-aware SRSS along with the two-phase EPLC scheme, exemplary non-limiting implementations of the invention enable TCAM 1 Gsearch/sec. throughput while maintaining total power for a 2048×640 instance of only about 0.76 W.

Figure 11:
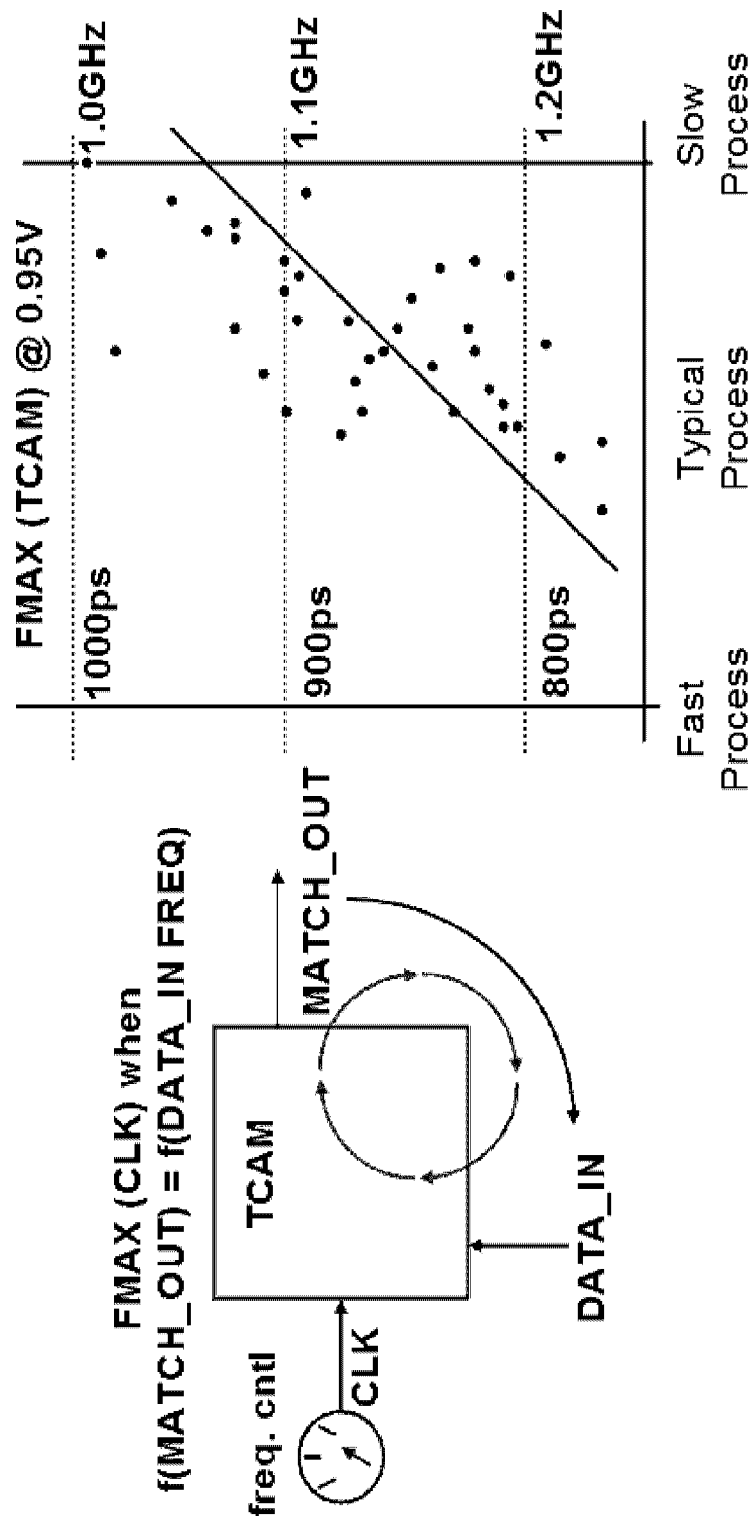
FIG. 11 illustrates silicon measurements exceeding 1 Gsearch/sec on TCAM hardware across a full process corner in accordance with aspects of the invention.
Figure 12:
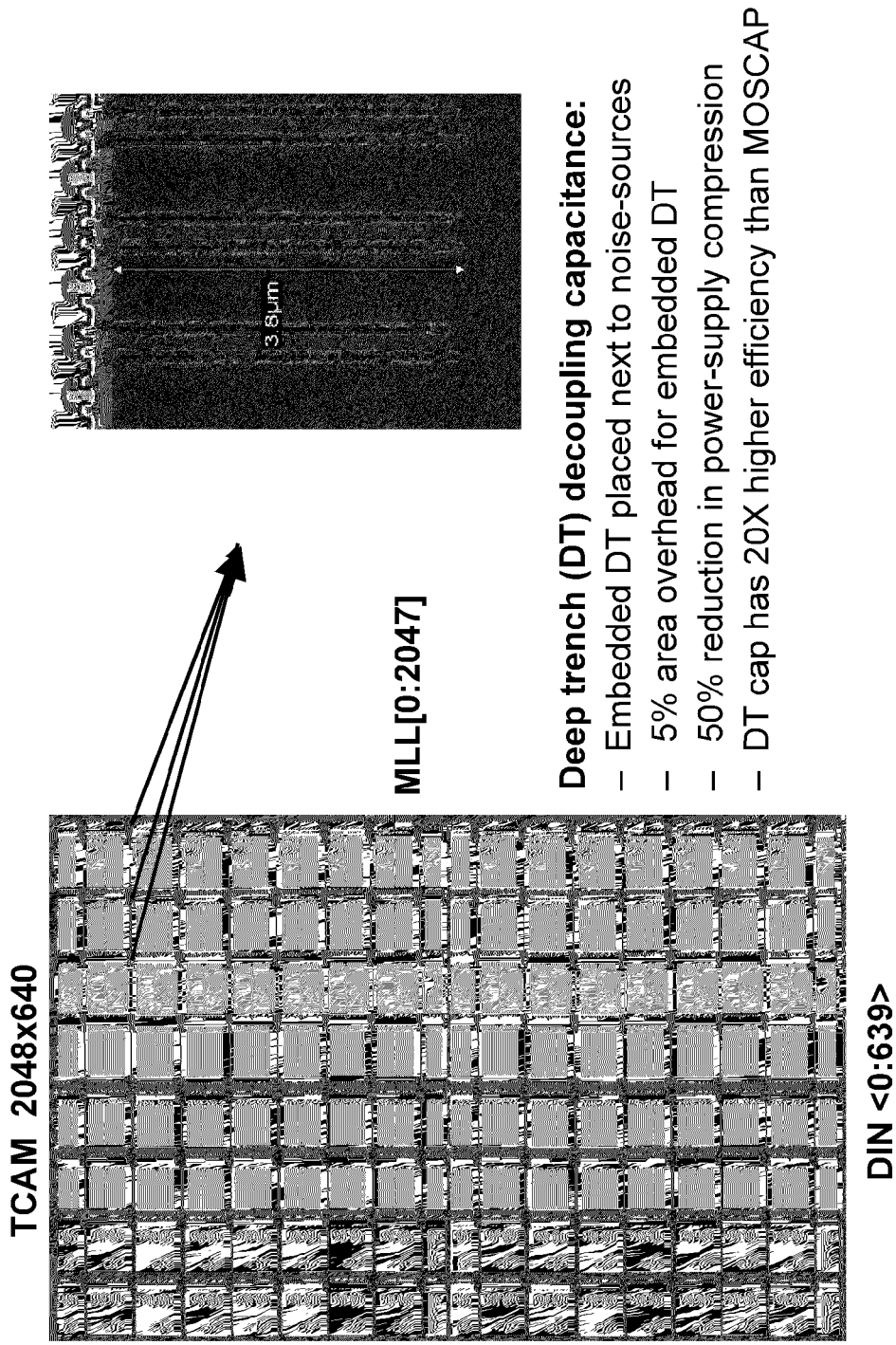
FIG. 12 shows a microphotograph of an exemplary TCAM with embedded deep-trench (DT) decoupling capacitors in accordance with aspects of the invention.

FIG. 11 illustrates silicon measurements exceeding 1 Gsearch/sec on TCAM hardware across the full process corner according to aspects of the invention. FIG. 12 shows a microphotograph of an exemplary compiled TCAM instance 2048×640b highlighting the placement of the embedded deep-trench (DT) decoupling capacitors for power supply noise mitigation in accordance with aspects of the invention. At 1 Gsearches/sec., the 5% DT decap area adder results in about 50% less power-supply noise compression ensuring proper operation in high capacity TCAM designs. TABLE I, below, illustrates exemplary non-limiting compiler range and TCAM specifications in accordance with aspects of the invention.

TABLE I

| | |
|---|---|
| Minimum Compiled Instance | 0064 entry × 012 bits (768 bit) |
| Maximum Compiled Instance | 2048 entry × 640 bits (1280 Kb) |
| Max TCAM Organization | 16 banks × 8 fields |
| Max Bank Organization | 128 words × 128 bits |
| Performance (@ 0.90 V) | 1.0 GHz |
| Power | 1.1 W |
| Density | 0.84 Mb/mm^2 |
| Technology | 32 nm high-K SOI process with Embedded deep trench DECAP |
| Power Conservation Options | Bank Selection Pre-Search Activation |
| Noise Reduction | 12 nF of DECAP |
| Operating Voltage Range | 0.70 V-1.10 V |
| Operating Temperature Range | −40° C.-125° C. |

Figure 13:
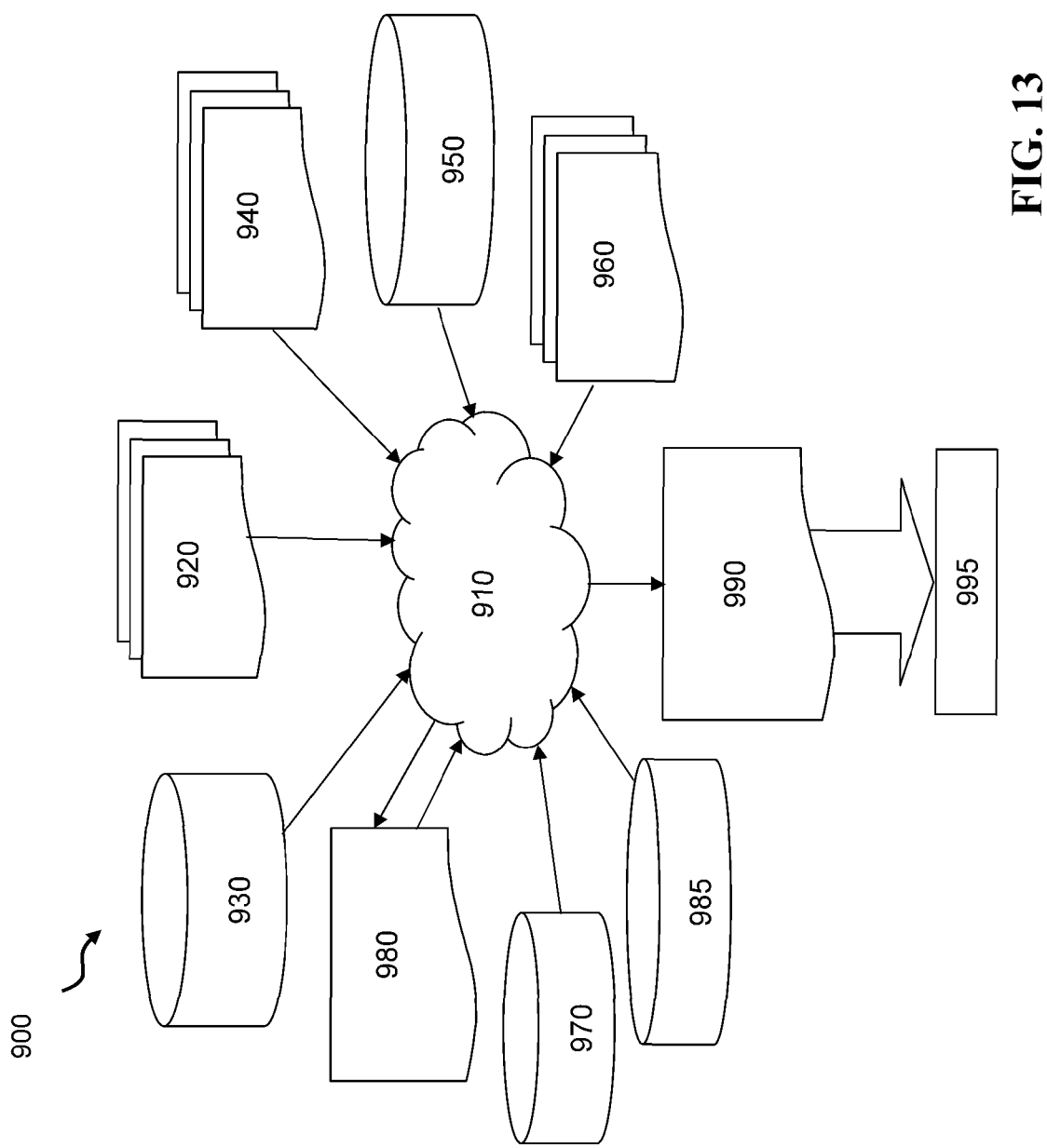
FIG. 13 is a flow diagram of a design process used in semiconductor design, manufacture, and/or test in accordance with aspects of the invention.

FIG. 13 is a flow diagram of a design process used in semiconductor design, manufacture, and/or test. FIG. 13 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 7. In one embodiment, design structure 990 may comprise a compiled, executable HDL simulation model that functionally simulates the devices shown in FIG. 7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 7. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A system for searching a content addressable memory (CAM), comprising:
    a circuit that selectively activates a main-search by searching a first set of cells of a two stage CAM search while a pre-search searches a second set of cells different from the first set of cells of the two stage CAM search and is still active,
    wherein the circuit is configured to overlap completion of the pre-search and starting of the main-search, and
    wherein a number of the first set of cells is greater than a number of the second set of cells.

2. The system of claim 1, wherein the circuit selectively activates the main-search based on preliminary results of the pre-search indicating a match.

3. The system of claim 2, wherein the circuit terminates the main-search when final results of the pre-search contradict the preliminary results.

4. The system of claim 1, wherein each stored word of the CAM includes an instance of the circuit, and wherein each instance of the circuit comprises:
    a start pre-search node connected to a pull-up stack comprising a first transistor and a second transistor connected between a voltage source and a pre-search match line (PML);
    a start main-search node connected to a first input of a NAND gate, wherein the PML is connected to a second input of the NAND gate;
    a third transistor controlled by an output of the NAND gate, wherein the third transistor selectively turns off the second transistor; and
    a fourth transistor controlled by the output of the NAND gate, wherein the fourth transistor is connected between the voltage source and a main-search match line (MML).

5. The system of claim 1, wherein the circuit comprises a pre-search match line (PML) connected to: a first plurality of pull-down stacks; pull-up devices; and an input of a NAND gate.

6. The system of claim 5, wherein an output of the NAND gate controls a switch that turns off the pull-up devices.

7. The system of claim 6, wherein a start main-search node is connected to another input of the NAND gate such that the NAND gate causes the switch to turn off the pull-up devices after the main-search has been started.

8. The system of claim 5, wherein:
    the circuit comprises a main-search match line (MML) connected to a second plurality of pull-down stacks; and
    an output of the NAND gate is connected to a switch that controls pre-charging the MML.

9. The system of claim 8, wherein the circuit further comprises:
a keeper stack connected between the output of the NAND gate and the MML;
a Schmitt trigger with an input connected to the MML and an output indirectly connected to a sense node; and
a tunable pin on the Schmitt trigger structured and arranged to adjust a hysteresis value of the Schmitt trigger.

10. The system of claim 1, wherein the CAM comprises a ternary CAM (TCAM).

11. A circuit, comprising:
a pre-search match line (PML) connected to a first plurality of cells of a content addressable memory (CAM);
a main-search match line (MML) connected to a second plurality of cells of the CAM; and
a combination of devices structured and arranged to:
start a pre-search operation associated with the PML; and
start a main-search operation associated with the MML prior to completion of the pre-search operation,
wherein the circuit is configured to overlap completion of the pre-search operation and starting of the main-search operation, and
wherein the combination of devices comprises:
a start pre-search node connected to a pull-up stack comprising a first p-type field effect transistor (pFET) and a second pFET connected between a voltage source and the PML;
a start main-search node connected to a first input of a NAND gate, wherein the PML is connected to a second input of the NAND gate;
a third pFET controlled by an output of the NAND gate, wherein the third pFET turns off the second pFET; and
a fourth pFET controlled by the output of the NAND gate, wherein the fourth pFET is connected between the voltage source and the MML.

12. The circuit of claims 11, wherein the combination of devices comprises:
an n-type field effect transistor (nFET) connected between the fourth pFET and the MML;
a sense node between the nFET and the fourth pFET;
an inverter and a latch connected to the sense node; and
a Schmitt trigger having an input connected to the MML and an output connected to the nFET.

13. The circuit of claim 12, wherein the combination of devices comprises:
a tunable pin on the Schmitt trigger structured and arranged to adjust a hysteresis value of the Schmitt trigger; and
a keeper stack connected between the output of the NAND gate and the MML.

14. A circuit, comprising:
an inverting Schmitt trigger having a low threshold, a high threshold, and a hysteresis value; and
a silicon aware tunable pin which is external to the Schmitt trigger and is connected to an input of the Schmitt trigger, wherein the Schmitt trigger and the tunable pin are structured and arranged such that adjusting a voltage on the silicon aware tunable pin selectively changes the hysteresis value of the Schmitt trigger to correspond to the adjusted voltage, wherein:
an input of the Schmitt trigger is connected to a main-search match line (MML) connected to a plurality of cells of a content addressable memory (CAM); and
an output of the Schmitt trigger is connected to a gate of a transistor that is connected between the MML and a sense node of a comparison circuit of the CAM.

15. The circuit of claim 14, wherein:
decreasing the voltage on the tunable pin increases the hysteresis value of the Schmitt trigger; and
increasing the voltage on the tunable pin decreases the hysteresis value of the Schmitt trigger.

16. The circuit of claim 14, further comprising:
a second transistor connected between the sense node and a voltage source; and
a transistor stack connected between a gate of the second transistor and the MML,
wherein the second transistor is a pFET device and a gate of the second transistor is connected to a NAND gate, and
wherein the transistor stack comprises a pFET-nFET stack.

17. The circuit of claim 14, further comprising:
an inverter connected between the sense node and a latch,
wherein the plurality of cells of the CAM are a plurality of pull-down stacks, and
the transistor is a nFET device.

18. A method of performing a memory operation in a computer memory, comprising:
starting a first stage of a two-stage memory operation in the computer memory by searching a first set of cells;
selectively starting a second stage of the two-stage memory operation by searching a second set of cells different from the first set of cells while the first stage is still executing and based on preliminary results of the first stage;
detecting a final result of the first stage after the starting the second stage; and
performing one of interrupting and completing the second stage based on the final result of the first stage,
wherein the selectively starting the second stage comprises overlapping completion of the first stage with starting of the second stage, and
wherein a number of the second set of cells is greater than a number of the first set of cells.

19. The method of claim 18, wherein the memory operation is a search operation and the selectively starting the second stage is based on the preliminary results of the first stage indicating a match, and further comprising:
interrupting the second stage when the final result of the first stage indicates a miss; and
completing the second stage when the final result of the first stage indicates a match.

20. The method of claim 18, wherein the computer memory comprises a content addressable memory (CAM).

21. The method of claim 18, wherein the computer memory comprises one of:
a dynamic random access memory (DRAM), static random access memory (SRAM), and non-volatile memory.

22. A method of searching a content addressable memory (CAM), comprising:
developing a voltage on a pre-search match line (PML) during a pre-search of a two-stage CAM search operation by searching a first set of cells;
detecting that the voltage exceeds a threshold level;
starting a main-search of the two-stage CAM search operation based on the detecting by searching a second set of cells different from the first set of cells and prior to completion of the pre-search; and
after the starting the main-search, performing one of:
detecting that the voltage drops below the threshold level and interrupting the main-search; and
detecting that the voltage remains above the threshold level and completing the main-search,
wherein a number of the second set of cells is greater than a number of the first set of cells.

23. The method of claim 22, further comprising adjusting leakage tolerance and response time of the main-search by adjusting a hysteresis value of a Schmitt trigger used in the main-search.

24. The method of claim 23, wherein:
the adjusting the hysteresis value of the Schmitt trigger used in the main search occurs by adjusting a voltage on a tunable pin connected to the Schmitt trigger, and
the adjusted hysteresis value of the Schmitt trigger corresponds to the adjusted voltage.

* * * * *